(12) United States Patent
Abbott et al.

(10) Patent No.: US 7,245,006 B2
(45) Date of Patent: Jul. 17, 2007

(54) PALLADIUM-SPOT LEADFRAMES FOR HIGH ADHESION SEMICONDUCTOR DEVICES AND METHOD OF FABRICATION

(75) Inventors: Donald C. Abbott, Norton, MA (US); Michael E. Mitchell, Plaistow, NH (US); Paul R. Moehle, Seekonk, MA (US); Douglas W. Romm, Sherman, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/212,828

(22) Filed: Aug. 25, 2005

(65) Prior Publication Data

US 2006/0001132 A1    Jan. 5, 2006

Related U.S. Application Data

(63) Continuation of application No. 09/733,718, filed on Dec. 8, 2000, now Pat. No. 6,953,986.

(60) Provisional application No. 60/170,248, filed on Dec. 10, 1999.

(51) Int. Cl.
*H01L 23/495* (2006.01)

(52) U.S. Cl. ..................... 257/677; 257/666; 438/123

(58) Field of Classification Search ............... 257/677, 257/666; 438/123
See application file for complete search history.

(56) References Cited

U.S. PATENT DOCUMENTS

| | | | |
|---|---|---|---|
| 5,360,991 A | 11/1994 | Abys et al. .................. | 257/666 |
| 5,521,432 A | 5/1996 | Tsuji et al. .................. | 257/677 |
| 5,635,755 A | 6/1997 | Kinghorn .................... | 257/666 |
| 5,767,574 A | 6/1998 | Kim et al. ................... | 257/677 |
| 5,882,955 A | 3/1999 | Huang et al. ................ | 438/111 |
| 5,977,620 A | 11/1999 | Kim et al. ................... | 257/677 |
| 6,087,712 A | 7/2000 | Kim et al. ................... | 257/666 |
| 6,232,651 B1 | 5/2001 | Lee et al. .................... | 257/666 |
| 6,245,448 B1 | 6/2001 | Abbott ....................... | 428/670 |
| 6,953,986 B2 * | 10/2005 | Abbott et al. ............... | 257/666 |

FOREIGN PATENT DOCUMENTS

JP    411111909 A    7/1997

* cited by examiner

*Primary Examiner*—Phat X. Cao
(74) *Attorney, Agent, or Firm*—Yungsheng Tung; Wade James Brady, III; Frederick J. Telecky, Jr.

(57) ABSTRACT

A leadframe for use in the assembly of integrated circuit chips comprising a base metal structure having an adherent layer of nickel covering said base metal; an adherent film of palladium on said nickel layer; and an adherent layer of palladium on said palladium film, selectively covering areas of said leadframe suitable for bonding wire attachment and solder attachment.

16 Claims, 2 Drawing Sheets

PALLADIUM-SPOT LEADFRAMES FOR HIGH ADHESION SEMICONDUCTOR DEVICES AND METHOD OF FABRICATION

This is a continuation of application Ser. No. 09/733,718 filed Dec. 8, 2000, which claims priority of application Ser. No. 60/170,248 filed on Dec. 10, 1999, now U.S. Pat. No. 6,953,986.

FIELD OF THE INVENTION

The present invention is related in general to the field of semiconductor devices and processes and more specifically to the materials and fabrication of leadframes for integrated circuit devices.

DESCRIPTION OF THE RELATED ART

The leadframe for semiconductor devices was invented (U.S. Pat. No. 3,716,764 and U.S. Pat. No. 4,034,027) to serve several needs of semiconductor devices and their operation simultaneously: First of all, the leadframe provides a stable support pad for firmly positioning the semiconductor chip, usually an integrated circuit (IC) chip. Since the leadframe including the pads is made of electrically conductive material, the pad may be biased, when needed, to any electrical potential required by the network involving the semiconductor device, especially the ground potential.

Secondly, the leadframe offers a plurality of conductive segments to bring various electrical conductors into close proximity of the chip. The remaining gap between the ("inner") tip of the segments and the conductor pads on the IC surface are typically bridged by thin metallic wires, individually bonded to the IC contact pads and the leadframe segments. Obviously, the technique of wire bonding implies that reliable welds can be formed at the (inner) segment tips.

Thirdly, the ends of the lead segment remote from the IC chip ("outer" tips) need to be electrically and mechanically connected to "other parts" or the "outside world", for instance to assembly printed circuit boards. In the overwhelming majority of electronic applications, this attachment is performed by soldering. Obviously, the technique of soldering implies that reliable wetting and solder contact can be performed at the (outer) segment tips.

It has been common practice to manufacture single piece leadframes from thin (about 120 to 250 µm) sheets of metal. For reasons of easy manufacturing, the commonly selected starting metals are copper, copper alloys, iron-nickel alloys (for instance the so-called "Alloy 42"), and invar. The desired shape of the leadframe is etched or stamped from the original sheet. In this manner, an individual segment of the leadframe takes the form of a thin metallic strip with its particular geometric shape determined by the design. For most purposes, the length of a typical segment is considerably longer than its width.

In the European patent No. 0 335 608 B1, issued 14 Jun. 1995 (Abbott, "Leadframe with Reduced Corrosion"), a palladium-plated leadframe is introduced which is not subject to corrosion due to galvanic potential forces aiding the migration of the base metal ions to the top surface where they will form corrosion products. The. patent describes a sequence of layers consisting of nickel (over the base metal), palladium/nickel alloy, nickel, and palladium (outermost). This technology has been widely accepted by the semiconductor industry.

After assembly on the leadframe, most ICs are encapsulated, commonly by plastic material in a molding process. It is essential that the molding compound, usually an epoxy-based thermoset compound, has good adhesion to the leadframe and the device parts it encapsulates. Palladium, described above as the outermost layer of the leadframe, offers excellent adhesion to molding compounds.

Unfortunately, palladium is expensive; its price climbed in the last decade from about one third of the gold price to about 20% higher than gold. Cost reduction pressures in semiconductor manufacturing have initiated efforts to reduce the thickness of the palladium layers employed to about one third of its previous thickness. At this thinness, palladium does not prevent oxidation of the underlying nickel which will inhibit its solderability (while maintaining bondability). A method introduced in semiconductor manufacturing uses a thin layer of gold on the palladium surface to prevent oxidation. One related example is described in U.S. Pat. No. 5,859,471, issued on Jan. 12, 1999 (Kuraishi et al., "Semiconductor Device having TAB Tape Leadframe with Reinforced Outer Leads").

In these methods, however, are also expensive and severely inhibit the adhesion of the leadframe segments to molding compounds and thus risk delamination in thermo-mechnical stress testing. Furthermore, any plating of the complete leadframe makes it difficult to decide by visual inspection whether a leadframe has a surface different from nickel or not. Such standard simple inspection, however, is highly desirable as manufacturing practice.

Last but not least, any plating or leadframe surface treatment has to maintain or promote solderability of the outer tips of the lead segments.

In U.S. Patent Application No. 60/138,070, filed on 8 Jun. 1999, to which the present invention is related, a fabrication process for palladium layers of reduced thickness is described (combined with a process for plating solder layers). However, in this method still too much palladium is consumed so that not enough cost reduction is achieved.

An urgent need has therefore arisen for a low-cost, reliable mass production method for a leadframe having reduced palladium layer thickness combined with solderability, bondability, adhesion capability to molding compounds, and visual inspection contrasts. The leadframe and its method of fabrication should be flexible enough to be applied for different semiconductor product families and a wide spectrum of design and assembly variations, and should achieve improvements toward the goals of improved process yields and device reliability. Preferably, these innovations should be accomplished using the installed equipment base so that no investment in new manufacturing machines is needed.

SUMMARY OF THE INVENTION

According to the present invention for a semiconductor integrated circuit (IC) leadframe, a base metal having a plated layer of nickel fully covering the base metal has a plated layer of palladium on the nickel layer selectively covering areas of the leadframe suitable for bonding wire attachment and solder attachment. Further, a plated thin film of palladium insures excellent leadframe adhesion to the encapsulating molding compound by allowing some nickel and nickel-oxide on the leadframe surface.

The present invention is related to high density ICs, especially those having high numbers of inputs/outputs, or contact pads, and also to devices in packages requiring surface mount in printed circuit board assembly. These ICs can be found in many semiconductor device families such as standard linear and logic products, digital signal processors, microprocessors, digital and analog devices, high frequency and high power devices, and both large and small area chip categories. The invention represents a significant cost reduction of the semiconductor packages, especially the plastic molded packages, compared to the conventional copper-based palladium-plated leadframes.

It is an aspect of the present invention to provide a technology for reducing the amount of costly noble metal, especially palladium, layers while simultaneously maintaining the bondability and solderability of the leadframe and improving its reliable adhesion to plastic molding compounds.

Another aspect of the invention is to apply the noble metal, such as palladium, in different thicknesses on the leadframe segments by plating in two steps.

Another aspect of the invention is to reach these goals without the cost of equipment changes and new capital investment, by using the installed fabrication equipment base.

Another aspect of the invention is to produce leadframes so that established wire bonding processes can continue unchanged, and that established board attachment process can continue unchanged.

Another aspect of the present invention is to introduce a manufacturing quality check based on a simple, low-cost visual inspection. This check insures the selection of the correct leadframe and its appropriate preparation before releasing it into the assembly process flow.

Another aspect of the invention is to introduce a palladium spot plating technology with provides loose tolerance for the spot boundaries, thus simplifying leadframe manufacturing and lowering fabrication cost.

These aspects have been achieved by the teachings of the invention concerning masking and deposition methods suitable for mass production. Various modifications of leadframe preparations have been successfully employed.

In the first embodiment of the invention, applicable especially for through-hole leadframes, the spot-plated palladium is deposited on the top and bottom surfaces of the external lead segment ends (and, of course, on the wire bonding areas of the internal lead ends).

In the second embodiment of the invention, applicable especially for surface-mount leadframes, the spot-plated palladium is deposited only on the bottom surface of the external lead segment ends involved in solder attachment to motherboards (and on the wire bonding areas of the internal lead ends).

For all embodiments, solderability, bondability, adhesion to plastics, and corrosion insensitivity are demonstrated. In this invention, the surface of the leadframe has nickel, nickel oxide and palladium character. This combination hinders copper creep corrosion, as compared to a surface with pure palladium.

Leadframes prepared according to the invention can be successfully used in surface mount technologies based on bending the package lead segments.

The technical advances represented by the invention, as well as the aspects thereof, will become apparent from the following description of the preferred embodiments of the invention, when considered in conjunction with the accompanying drawings and the novel features set forth in the appended claims.

DETAILED DESCRIPTION OF THE PREFERRED EMBODIMENTS

Figure 1:
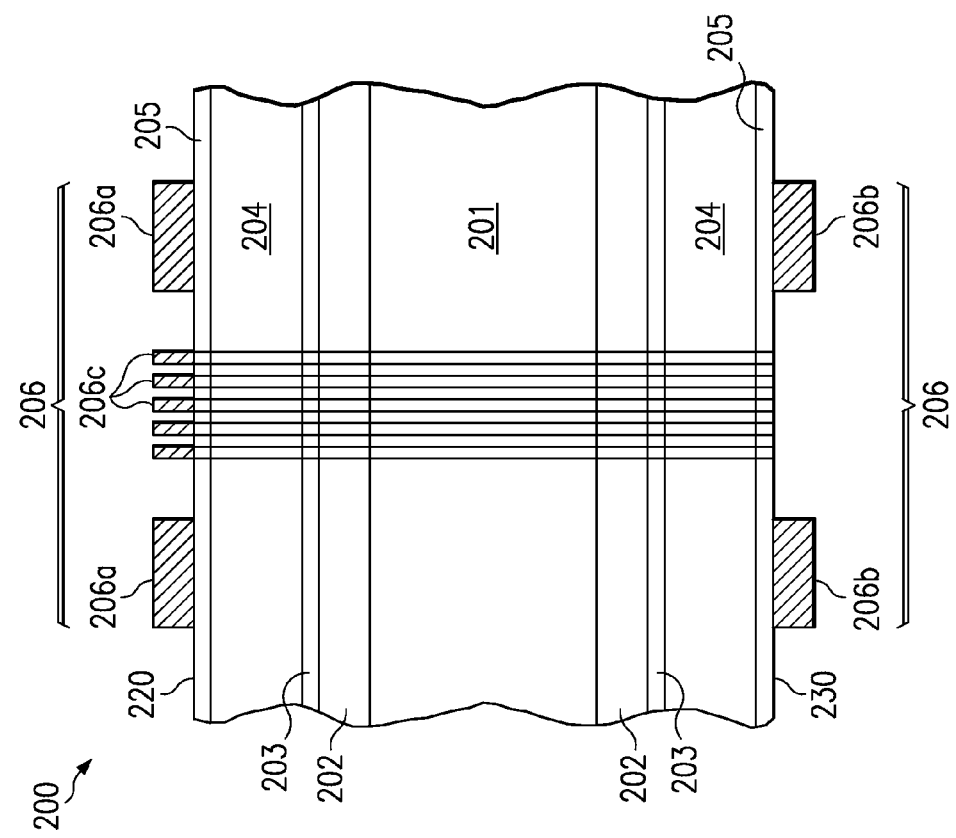
FIG. 1 is a simplified top view of a leadframe unit for through-hole semiconductor devices, delineating the masking needed in the fabrication method of the first embodiment of the invention.

The present invention is related to the assembly of semiconductor ICs on leadframes, including wire bonding interconnection, and their final encapsulation, the sequential construction of these leadframes using deposited layers of various metals, and the process of fabricating these leadframes so that they offer quality-related visual inspection and reliable solder attachment to substrates.

The invention reduces the cost of leadframes while the leadframe functions are maximized. The invention best applies to any leadframe and any substrate used in semiconductor technology which exhibit the following design features: Usually, a chip mount pad for support of the IC chip surrounded by lead segments, each having a first end in proximity of the chip pad, and a second end remote from the chip pad. The invention thus applies to semiconductor package types such as PDIPs, SOICs, QFPs, SSOPs, TQFPs, TSSOPs and TVSOPs.

As defined herein, the starting material of the leadframe is called the "base metal", indicating the type of metal. Consequently, the term "base metal" is not to be construed in an electrochemical sense (as in opposition to 'noble metal') or in a structural sense. The base metal of leadframes is typically copper or copper alloys. Other choices comprise brass, aluminum, iron-nickel alloys ("Alloy 42"), and invar.

Leadframe segments have to satisfy five needs in semiconductor assembly:

1) Leadframes have to comprise segment ends remote from the chip mount pad ("outer segments") for solder attachment to other parts;
2) leadframes have to comprise segment ends near the chip mount pad ("inner segments") for bond attachments to wire interconnections;
3) leadframes have to comprise outer segments ductile for forming and bending the segments;
4) leadframe surfaces have to comprise adhesion to molding compounds, and
5) leadframe segments have to comprise insensitivity to corrosion.

According to the teachings of this invention, Need 1) is satisfied by depositing a layer of nickel, fully covering the leadframe base metal, and then selectively plating a layer of palladium where a solder joint has to be made. In the first embodiment of the invention, applicable especially to leadframes with pin-shaped outer segment ends (for through-hole assembly of devices), palladium is plated on both surfaces of the segment ends. In the second embodiment of the invention, applicable especially to leadframes with gull-wing or J-shaped outer segment ends (for surface mount assembly of devices), palladium is plated only on the surface of the segment ends facing the assembly board.

This invention provides the option to retain the palladium thickness where it is needed for solder attachment purposes, but reduces it in other places. For example, for surface-mount devices with gull-wing shaped leads, the outer surfaces may retain 70–80 nm palladium, but exhibit only 20–30 nm on the inner surfaces. This is achieved by a two-step plating process.

The invention satisfies Need 2) by first plating the nickel layer, fully covering the leadframe base metal as outlined above, and then plating a thin layer of palladium onto the nickel layer, selectively covering areas of the leadframe which are intended for bonding wire attachment (and chip attachment). For palladium, a thin layer is sufficient for reliable bonding wire attachment (stitch bonds, ball bonds, or wedge bonds).

The invention satisfies Need 3) by the selection of thickness and structure of the nickel layer employed to fulfill Need 1). Thickness and deposition method of the nickel layer have to be selected such that the layer insures ductility and enables the bending and forming of the outer lead segments.

The invention satisfies Need 4) by depositing a thin film of palladium on the whole nickel surface of the leadframe concurrently with the plating process employed for fulfilling need 2). The surface thus provides for the formation of nickel oxide in amounts aiming to maximize adhesion of the leadframe to thermoset molding compounds and other encapsulation materials.

The invention satisfies Need 5) by the sequence of layers deposited over the copper base. The improved corrosion insensitivity in mixed flowing gas corrosion tests is due to the leadframe surface achieved by the invention, which has nickel, nickel oxide and palladium character. This surface hinders copper creep corrosion (as compared to surfaces with pure palladium), which is a function of the nobility of the exposed surface.

According to the invention, the palladium layer required to satisfy Needs 1) and 2) is deposited by a selective plating process. The selective characteristic of the palladium deposition is achieved by a temporary masking step, which leaves only those leadframe portions exposed which are intended to receive the palladium layer. An example of the extent of such masking is depicted in FIG. 1, which shows a single (interdigitated) leadframe unit from a continuous strip, for a typical semiconductor Dual-In-Line device. The temporarily masked parts of the leadframe unit are shaded and the exposed parts are unshaded. The unmasked parts include outer leadframe segments 111, further portions 112a of the inner lead segments 112, and the chip mount pad 130.

As defined herein, each lead segment 110 has a first end 112a near the chip mount pad 113 and a second end 111 remote from chip mount pad 113. For the dual-in-line leadframe of FIG. 1, the second segment end 111 represents the external lead (for some surface-mount leadframes, however, the segment functions may be designed as two distinct parts). In the example of FIG. 1, the leadframe unit has 16 lead segments 110, since it is designed for a plastic 16-pin dual-in-line package (PDIP). In summary, the exposed parts which receive the palladium plating, include the first ends 112a of lead segments 110, the second ends 111 of the lead segments, and the chip mount pad 130.

Figure 2:
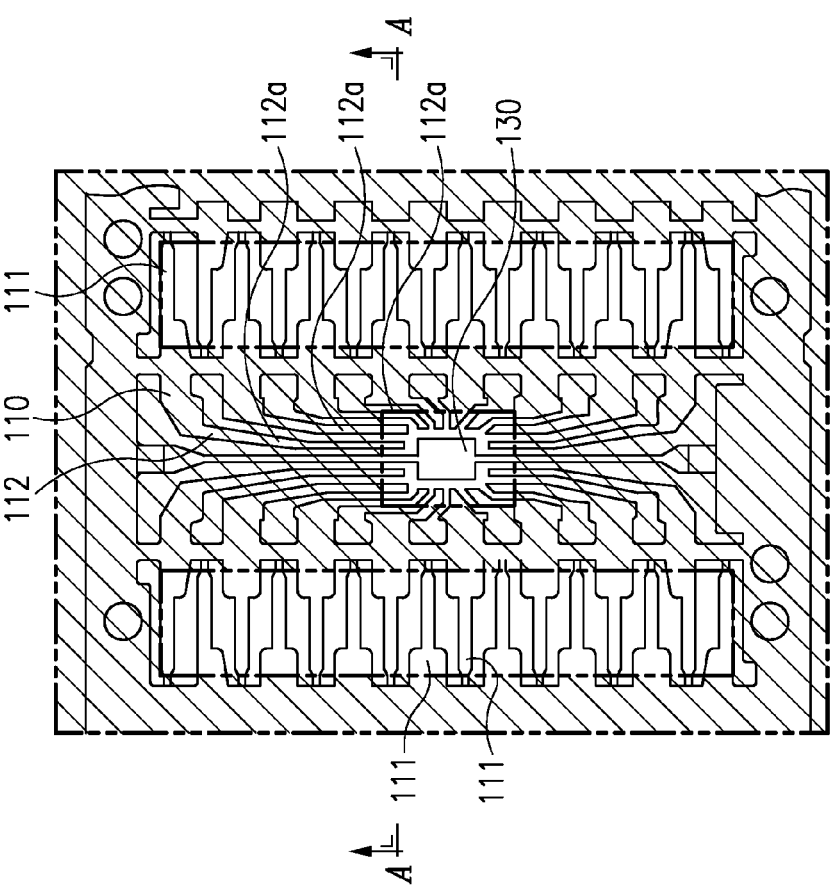
FIG. 2 is a schematic cross sectional view of a portion of a leadframe (as shown in FIG. 1) made according to the first embodiment of the invention.

After the selective plating of the palladium layer, a cross section along line "A—A" in FIG. 1 results in the schematic view generally designated 200 in FIG. 2, exaggerated in the vertical for clarity. The copper or copper alloy base sheet 201 has a preferred thickness in the range from 100 to 300 µm; thinner sheets are possible. The ductility in this thickness range provides the 5 to 15% elongation needed in any segment bending and forming operation. The leadframe is stamped or etched from the starting metal sheet.

The stamped or etched leadframe is first immersed in an alkaline preclean solution at 20 to 90° C. for few seconds up to 3 minutes. Oils, grease, soil, dirt and other contamination are thereby removed. After rinsing, the leadframe is next immersed in an acid activation bath at room temperature for few seconds up to 5 minutes. The bath consists of a solution of sulfuric acid, hydrochlorid acid, or other acid solution, preferably at about 30 to 60 g/l concentration. This solution removes copper oxide and leaves the metallic copper oxide surface in an activated state, ready to accept the deposition of metallic nickel.

The nickel layers 202 are electroplated to a thickness in the range between about 50 and 150 nm. The next deposited layers 203 are an alloy between nickel and a noble metal selected from a group consisting of palladium, rhodium, gold silver, and platinum. The preferred choice is palladium, with 60 to 80% palladium. The alloy layer is deposited by electroplating and between about 25 and 150 nm thick; it should be coherent since its main purpose is corrosion protection.

The important layers 204 are electroplated nickel, deposited preferably for a thickness of about 0.5 to 3 µm. This nickel layer has to be ductile in order to be malleable in any leadframe segment bending and forming process. Further, the nickel surface has to be wettable in the soldering process, so that solder alloys or conductive adhesives can be used successfully.

The overall thickness of the two nickel layers and the nickel alloy layer is in the range of about 650 to 4000 nm.

The next deposited layers of the embodiment in FIG. 2 are the layers 205 and 206, comprising an electroplated noble metal selected from a group consisting of palladium, rhodium, gold and silver. Layers 205 and 206 are made of the same materials, since they are deposited in the same process step (see below under "Wheel System"). The preferred embodiment is palladium. According to the invention, layer 105 is a thin film between about 1 and 5 nm thick, when palladium is chosen. At this thinness, only very little palladium material is consumed, and some nickel from underlying layer 204 can diffuse through the palladium and oxidize at the surface to nickel oxide. Consequently, the surface assumes a combined nickel/nickel oxide/palladium character and the nobility of the exposed surface is reduced. This fact, in turn, diminishes the copper creep corrosion of the leadframe, which is a function of the nobility of the exposed surface.

Furthermore, it is pivotal for the present invention that the described palladium film provides for excellent adhesion to thermoplastic molding compounds—an attribute crucial for avoiding package delamination and related degradations such as the infamous "popcorn effect".

Layers 206 are between about 70 and 90 nm thick. According to the invention, they are deposited onto the leadframe surfaces not masked in the masking step described above. In FIG. 2, palladium layer portions are deposited in the areas of the "remote" segments ends onto the first leadframe surface 220 to form layers 206a, and onto the second leadframe surface 230 to form layers 206b. Both palladium layer portions provide the precondition for successful solder attachment. Further, palladium layer portions are deposited in the areas of the "near" segment ends onto the first leadframe surface 220 to form layers 206c. These palladium portions provide the precondition for successful bond wire attachment (stitch bonds, ball bonds, and wedge bonds).

It should be noted that in the thickness range from 70 to 90 nm, palladium provides a visual distinction between the plated areas and the adjacent thin palladium film surfaces. This contrast between covered and not-covered areas can readily be noticed by the unaided eye and is, therefore, well suited for automated visual inspection in manufacturing process control, contributing to product quality assurance.

There are several methods to selectively deposit metals from solution onto a continuous strip. For high volume production of leadframes, continuous strip or reel-to-reel plating is advantageous and common practice. Based on the loose tolerance acceptable for the boundaries of the palladium plating on the first ends of the lead segments, the preferred deposition method for the present invention is the so-called "wheel system". The process steps are as follows.

Wheel System
  Material is moved over a large diameter wheel with apertures in it to allow solution flow to material;
  apertures define the locations for plating; index pins engage the pilot holes (designated 37 in FIG. 3) in the leadframe;
  backing belt is used to hold material on wheel and mask backside of material;
  anode is stationary inside wheel.

Advantages:
  Fast, material never stops for selective plating; no timing issues; pumps, rectifiers, and drive system are on continuously; low cost because system is mechanically uncomplicated.

Disadvantages:
  Loose plating boundaries, poor spot location, and potential bleedout are not critical issues for the present invention.

Figure 3B:
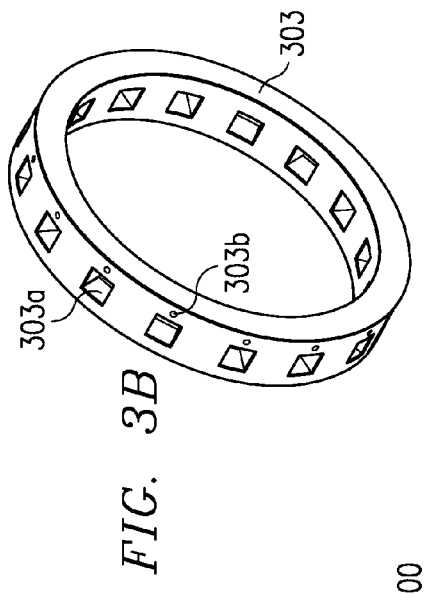
FIG. 3B illustrates schematically detail of the wheel used in the plating apparatus of FIG. 3A.
Figure 3A:
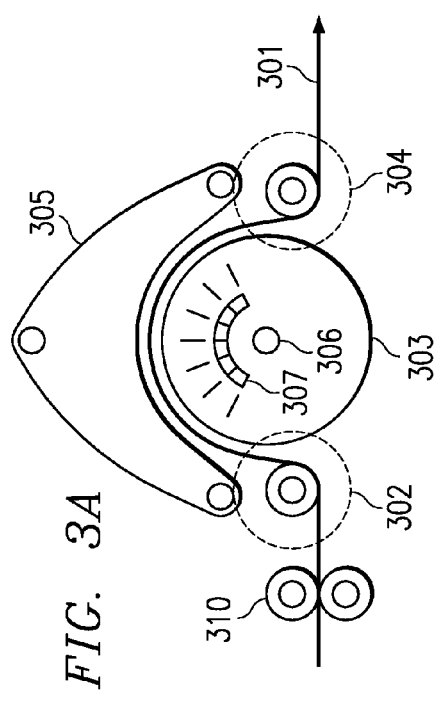
FIG. 3A illustrates schematically portions of the plating apparatus used in fabricating leadframes according to the invention.

FIGS. 3A and 3B illustrate schematically important portions of the "Wheel System" apparatus used for fabricating leadframes according to the invention. FIG. 3A shows the continuous leadframe strip 301 arriving from the nickel pre-plating station, described above, and progressing continuously from entry zone 302 through the wheel and masking sections of the apparatus to the exit zone 304. The wheel and masking sections consist of the plastic wheel 303 and the rubber masking belt 305. The tension of the belt is adjustable for precision masking. The plastic wheel 303, shown in more detail in FIG. 3B, provides spot apertures 303a and index pins 303b. The plating solution is pumped from the central region of the wheel system through the anode and sparger 307, spraying the solution (the cathode 310 is located in front of entry zone 302).

The relatively thick palladium layers are plated within the wheel and masking section. One plating section, shown in FIG. 3A, serves the first surface of the leadframe, an analogous section, not shown in FIG. 3A, serves the second surface. In contrast, the thin palladium films so important for the present invention are plated in entry zone 302 and exit zone 304. The leadframe strip passes through these zones fast and the concentration of plating solution in the ambient is low.

After exiting from zone 304, the leadframe strip 301 progresses to the rinsing and drying stations and further processings steps.

A more precise, but also more costly and slower selective plating technique is the step-and-repeat process.

Step and Repeat
  Leadframe material is stopped in selective plating head;
  rubber mask system clamps on material;
  plating solution is jetted at material;
  current is applied;
  current is shut off;
  solution is shut off;
  head opens;
  material moves.

Advantages:
  Very sharp plating spot with excellent edge definition; very good spot location capability when used with index holes, pins and feedback vision system.

Disadvantages:
  Slow; material must stop during selective plating; expensive equipment to buy and maintain; timing issues; lots of moving parts.

Figure 4:
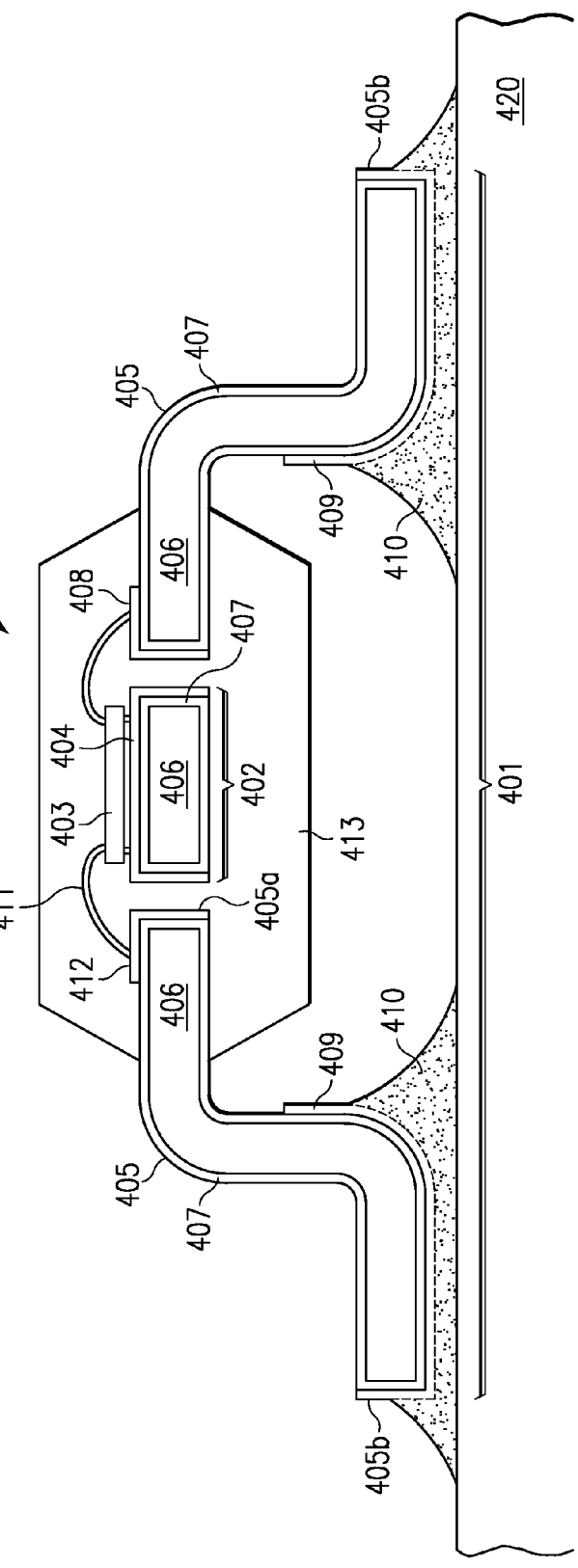
FIG. 4 is a schematic and simplified cross sectional view of a packaged, surface-mounted semiconductor device having a leadframe according to the second embodiment of the invention.

FIGS. 1 and 2 depict the first embodiment of the invention, which is especially applicable to through-hole leadframes. The spot-plated palladium is deposited on the first (top) and second (bottom) surfaces of the external lead segment ends. In FIG. 4, the second embodiment of the invention is illustrated, especially applicable to surface-mount leadframes. Here, the spot-plated palladium is deposited only on the bottom surface of the external lead segment ends (about 70–80 nm thick), which are involved in the solder attachment process of the semiconductor device to interconnection boards or motherboards. On the lead surfaces not involved in solder attachment, palladium may only be 20–30 nm thick. Of course, the palladium is also plated onto the wire bonding areas of the internal lead ends. Typically, these external device leads are formed, usually in either gull-wing shape or J-shape. An example for a gull-wing shaped device is shown in FIG. 4.

In the schematic cross section of FIG. 4, the copper or copper alloy leadframe 401 of the invention is shown as applied in the assembly of a semiconductor package generally designated 400. Leadframe 401 has a chip mount pad 402 onto which an IC chip 403 is attached using adhesive material 404 (typically an epoxy or polyimide which has to undergo polymerization). Leadframe 401 further has a plurality of lead segments 405. These lead segments have a first end 405a near the chip mount pad 402 and their second end 405b remote from mount pad 402.

As shown in FIG. 4 schematically, leadframe 401 comprises base 406 made of copper or copper alloy. On the surface of this copper is a sequence of layers, described in detail in FIG. 2. Closest to the copper is a first layer 407 of nickel. This layer is actually a stack of layers, followed by spot-plated layers 408 and 409 of palladium. Palladium layer 609 is incorporated into the meniscus of the bulk solder 610 in the process of surface-mounting device 400 onto a substrate or board 420.

In FIG. 4, bonding wires 411 have stitches 412 welded to the palladium surface 408 of the first ends 405a of leadframe segments 405. The bonding wires are selected from a group consisting of gold, copper, aluminum, and alloys thereof. Any of these metals provide reliable welds to the layered leadframes of the invention.

As shown in FIG. 4, the second ends 405b of segments 405 are suitable for bending and forming due to the ductility of the copper base and the plated nickel layer. Using this malleable characteristic, segments 405 may be formed in any shape required for surface mounting or any other technique of board attach of the semiconductor devices. The bending of the segments does not diminish the corrosion protection of the second segment ends 405b. For example, FIG. 4 indicates a so-called "gull wing shape" of segments 405. This shape is widely used for IC packages in the so-called "small outline" configuration, as illustrated in FIG. 4.

The palladium spot-plated copper leadframe of the invention provides for easy and reliable solder attachment to boards or other parts of the formed leadframe segments. In FIG. 4, solder attach material 410 comprises materials selected from a group consisting of tin/lead mixture, tin/indium, tin/silver, tin/bismuth, tin/copper, tin/silver/copper, and conductive adhesive compounds. All of these materials show good wetting characteristics to the plated nickel surface of the copper leadframes.

In FIG. 4, molding compound 413 encapsulates the mounted chip 403, bonding wires 411 and the first ends 405a of the lead segments 405. The second, remote ends 405b of the segments are not included in the molded package; they remain exposed for solder attachment. Typically, the encapsulation material 413 is selected from a group consisting of epoxy-based molding compounds suitable for adhesion to the leadframe surfaces. For the thin palladium film of the invention, excellent adhesion characteristics to molding compounds can be achieved, preventing package delamination, moisture ingress and corrosion. This improved adhesion of the molding compound is achieved, according to the invention, by creating a leadframe surface exhibiting some nickel and nickel oxide in conjunction with palladium.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the material of the semiconductor chip may comprise silicon, silicon germanium, gallium arsenide, or any other semiconductor material used in manufacturing. As another example, the design, cover area and fabrication method of the palladium layer may be modified to suit specific leadframe or substrate needs. It is therefore intended that the appended claims encompass any such modifications or embodiments.

We claim:

1. A device; comprising:
   a leadframe including:
      a base metal structure selected from a group consisting of copper, copper alloy, aluminum, iron-nickel alloy, brass, and invar;
      a nickel layer covering the base metal structure;
      a palladium film covering the nickel layer;
      a palladium layer selectively covering areas of the leadframe suitable for bonding wire attachment and solder attachment; and
      the palladium layer providing visual distinction to the areas covered by the layer over the areas of the palladium film uncovered by the palladium layer; and
   a semiconductor chin mounted on the leadframe.

2. The device of claim 1, in which the nickel layer has a thickness in the range from approximately 1 to 3 μm.

3. The device of claim 1, in which the nickel layer is a stack of a nickel layer in the thickness range from about 30 to 50 nm, plated onto said base metal, followed by a palladium/nickel layer in the thickness range from about 30 to 50 nm, followed by a nickel layer in the thickness range from about 1.0 to 3.0 μm.

4. The device of claim 1, in which the palladium film has a thickness from about 1 to 5 nm.

5. The device of claim 1, in which the palladium layer has a thickness from about 70 to 90 nm.

6. The device of claim 1, in which the palladium layer covers selective areas having boundaries of loose tolerance.

7. The device of claim 1, in which the base metal has a thickness between about 100 and 250 μm.

8. The device of claim 1, in which the solder attachment comprises materials selected from a group consisting of tin/lead, tin/indium, tin/silver, tin/bismuth, tin/copper, tin/silver/copper, and conductive adhesive compounds.

9. The device of claim 1, in which the solder layer has a reflow temperature compatible with wire bonding temperatures and molding temperatures.

10. The device of claim 1, in which the leadframe further includes a chip mount pad for an integrated circuit chip and a plurality of lead segments, each segment having a first end near said mount pad and a second end remote from said mount pad.

11. The device of claim 10, in which the semiconductor chip is mounted on the chip mount pad.

12. The device of claim 11, further comprising a bonding wire connecting the chip and a first end of the lead segments.

13. The device of claim 12, further comprising encapsulation material surrounding the chip, the bonding wire, and the first ends of the lead segments; and leaving the second ends of the lead segments un-encapsulated.

14. The device of claim 12, in which the bonding wire is selected from a group consisting of gold, copper, aluminum and alloys thereof.

15. The device of claim 11, in which the bonding wire contacts the first end with a stitch bond, a ball bond, or a wedge bond.

16. A method for fabricating a semiconductor device; comprising the steps of:
   providing a leadframe, which includes:
      a base metal structure;
      a nickel layer covering the base metal structure;
      a palladium film covering the nickel layer;
      a palladium layer selectively covering areas of the leadframe suitable for bonding wire attachment and solder attachment; and
   the palladium layer providing visual distinction to the areas covered by the layer over the areas of the palladium film uncovered by the palladium layer; and
   mounting a semiconductor chip on the leadframe.

* * * * *

UNITED STATES PATENT AND TRADEMARK OFFICE
CERTIFICATE OF CORRECTION

PATENT NO.         : 7,245,006 B2
APPLICATION NO.    : 11/212828
DATED              : July 17, 2007
INVENTOR(S)        : Donald C. Abbott et al.

It is certified that error appears in the above-identified patent and that said Letters Patent is hereby corrected as shown below:

Column 6, line 46, change 105 to 205.

Signed and Sealed this

Twenty-ninth Day of September, 2009

David J. Kappos
*Director of the United States Patent and Trademark Office*